United States Patent
Ponoth et al.

(10) Patent No.: US 8,349,674 B2
(45) Date of Patent: Jan. 8, 2013

(54) FORMING BORDERLESS CONTACT FOR TRANSISTORS IN A REPLACEMENT METAL GATE PROCESS

(75) Inventors: Shom Ponoth, Albany, NY (US); David V. Horak, Essex Junction, VT (US); Charles W. Koburger, III, Albany, NY (US); Chih-Chao Yang, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/073,151

(22) Filed: Mar. 28, 2011

(65) Prior Publication Data

US 2012/0248508 A1 Oct. 4, 2012

(51) Int. Cl.
*H01L 21/338* (2006.01)
(52) U.S. Cl. ........ 438/183; 438/197; 438/585; 438/300; 257/E21.159; 257/E21.409
(58) Field of Classification Search .................. 438/183, 438/259, 300, 197, 585, 586, 589, 652, 976; 257/E21.159, E21.409
See application file for complete search history.

(56) References Cited

U.S. PATENT DOCUMENTS

| | | | |
|---|---|---|---|
| 4,944,682 A | 7/1990 | Cronin et al. | |
| 5,143,861 A | 9/1992 | Turner | |
| 5,874,760 A | 2/1999 | Burns, Jr. et al. | |
| 6,274,894 B1 | 8/2001 | Wieczorek et al. | |
| 7,230,296 B2 | 6/2007 | Gluschenkov et al. | |
| 7,271,049 B2 | 9/2007 | Gluschenkov et al. | |
| 2005/0158935 A1 | 7/2005 | Shin et al. | |
| 2008/0076216 A1 | 3/2008 | Pae et al. | |
| 2009/0001480 A1 | 1/2009 | Cheng | |
| 2010/0065926 A1 | 3/2010 | Yeh et al. | |
| 2012/0132998 A1* | 5/2012 | Kwon et al. | 257/369 |

OTHER PUBLICATIONS

Notification of Transmittal of the International Search Report and the Written Opinion of the International Searching Authority, or the Declaration, Dated Jul. 23, 2012, by Jung Jin Kim; International Application No. PCT/US2012/023064, Filed: Jan. 30, 2012, Korean Intellectual Property Office.

* cited by examiner

*Primary Examiner* — Jack Chen
(74) *Attorney, Agent, or Firm* — Yuanmin Cai

(57) ABSTRACT

Embodiments of the present invention provide a method of forming a semiconductor structure. The method includes creating an opening inside a dielectric layer, the dielectric layer being formed on top of a substrate and the opening exposing a channel region of a transistor in the substrate; depositing a work-function layer lining the opening and covering the channel region; forming a gate conductor covering a first portion of the work-function layer, the first portion of the work-function layer being on top of the channel region; and removing a second portion of the work-function layer, the second portion of the work-function layer surrounding the first portion of the work-function layer, wherein the removal of the second portion of the work-function layer insulates the first portion of the work-function layer from rest of the work-function layer.

21 Claims, 8 Drawing Sheets

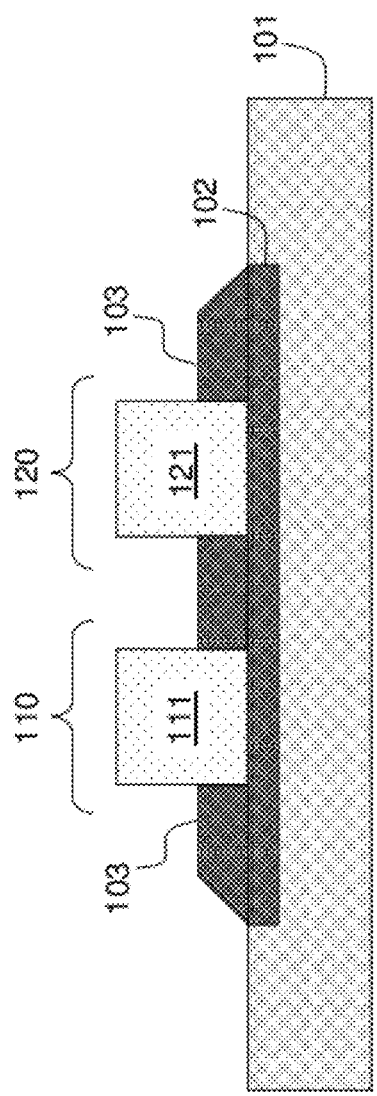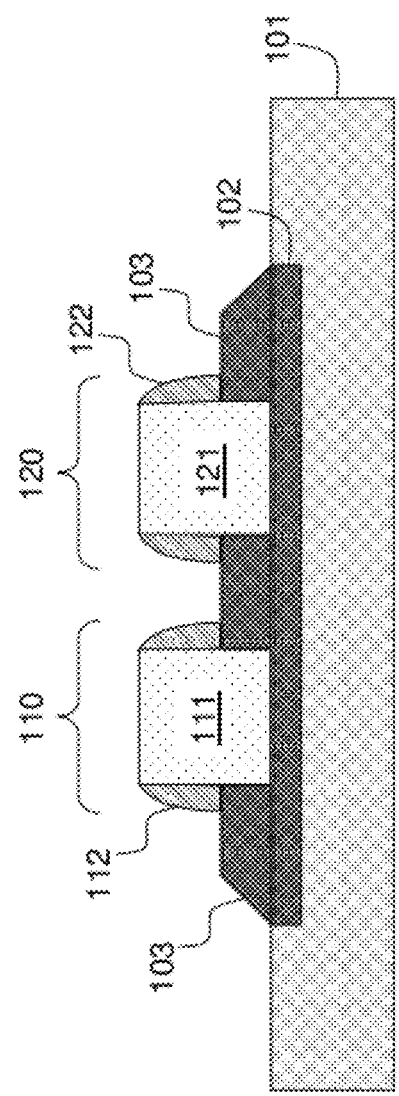
FIG. 1(a)
FIG. 1(b)

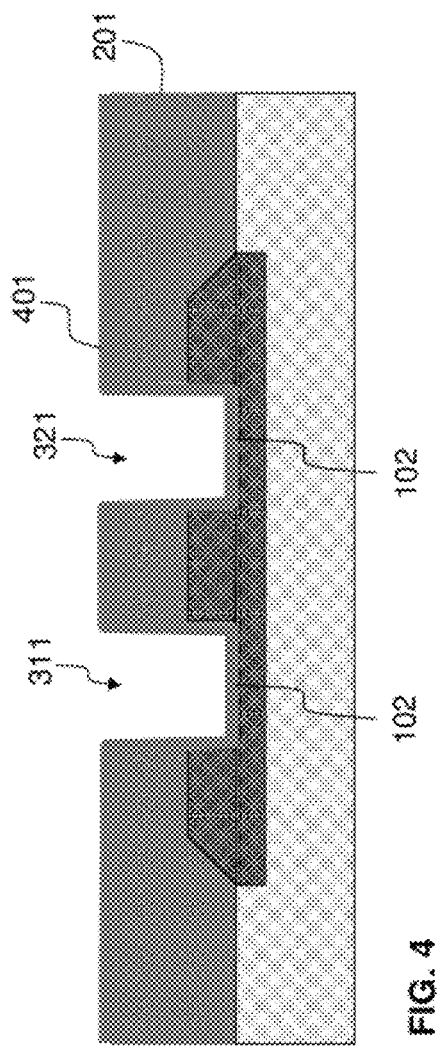
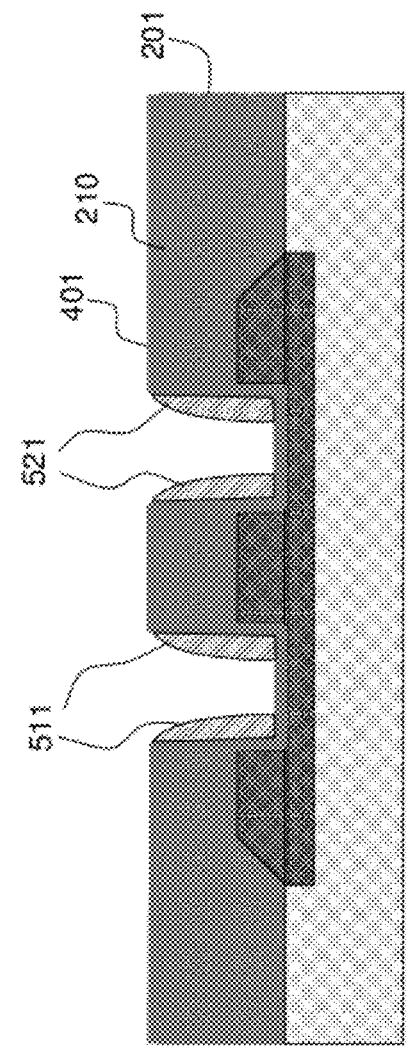

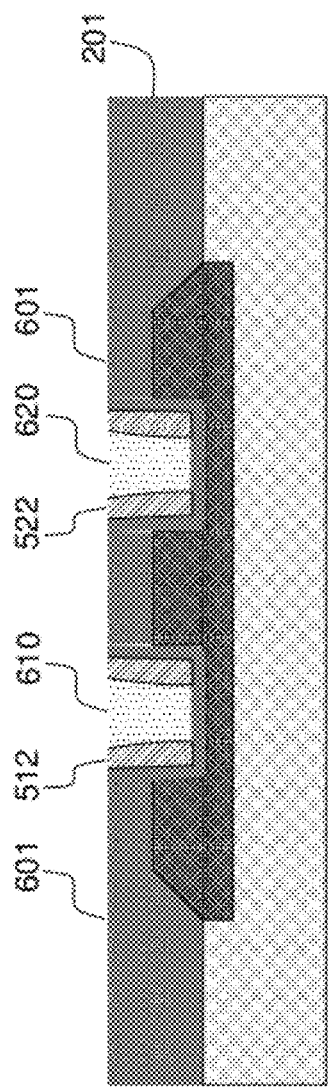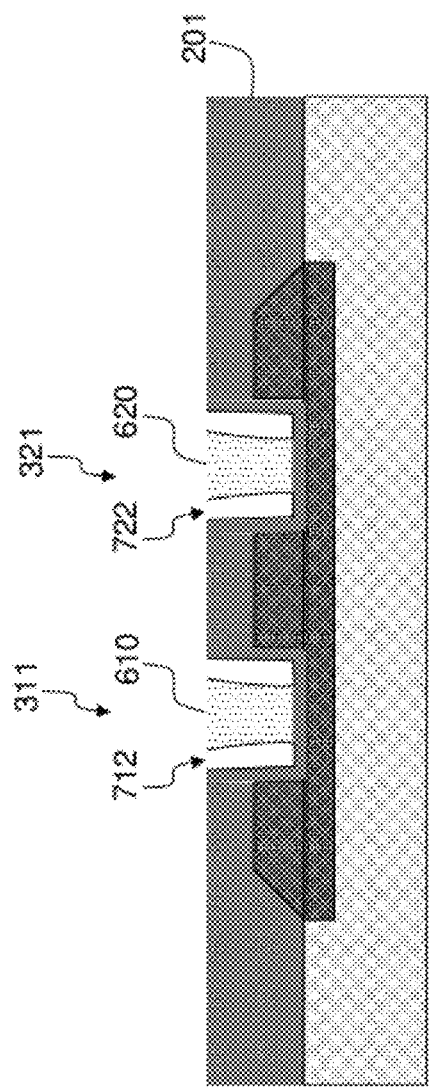

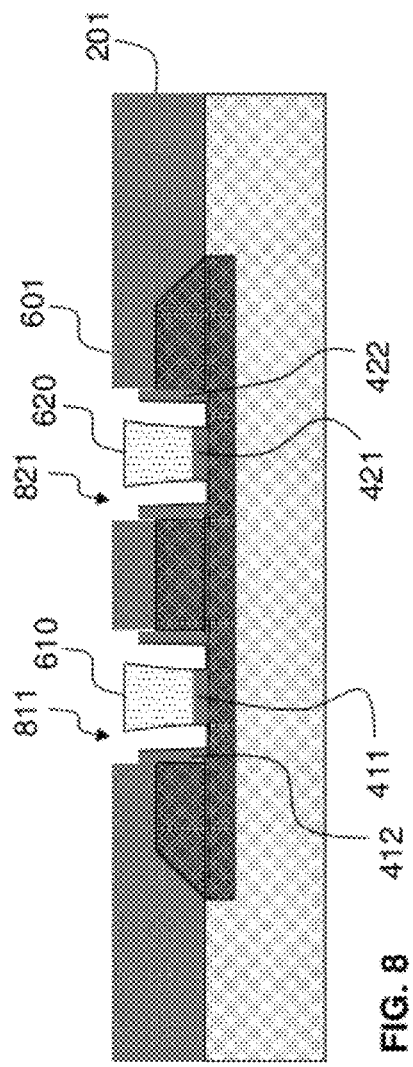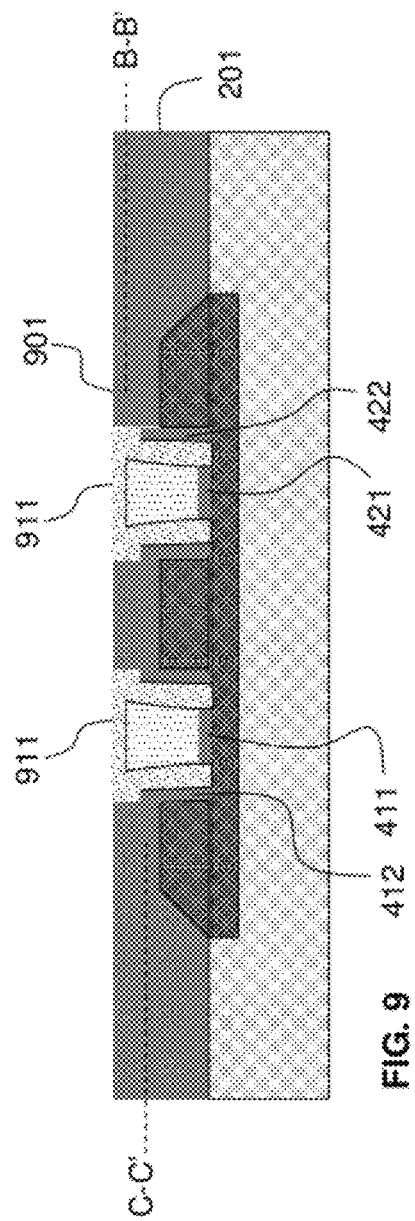

_US 8,349,674 B2_

FORMING BORDERLESS CONTACT FOR TRANSISTORS IN A REPLACEMENT METAL GATE PROCESS

FIELD OF THE INVENTION

The present invention relates generally to the field of semiconductor device manufacturing and in particular relates to method of forming borderless contact for transistors formed by a replacement metal gate process.

BACKGROUND OF THE INVENTION

In the field of semiconductor device manufacturing, transistors are generally manufactured by front end of line (FEOL) technologies. High-k metal gate (HKMG) transistors have been widely used because of their superior performance over conventional poly-based transistors. Various processes have been developed to manufacture HKMG transistors including, among others, a gate-last replacement metal gate (GL-RMG) process, which is considered as one of the most promising processes.

Generally, after structure of a transistor is formed, conductive contacts are formed to connect to the source, drain, and/or gate of the transistor in order to make the transistor fully functional. With the continuing scaling down in device dimension in integrated circuitry, real estate for forming conductive contacts is also becoming smaller and smaller. As a result, contacts that are borderless to the device, which generally requires less real estate, are making their way into logic structures such as transistors.

However, despite some demonstrated feasibility of forming borderless contacts for transistors that are made by non-replacement metal gate (non-RMG) processes, technical difficulty still exists in integrating approaches that are used in a non-RMG process into a RMG process. For example, when applying an non-RMG approach to form borderless contacts in a GL-RMG process, the top portion of spacers that are formed next to the gate will inevitably become compromised during the RMG process, as is known in the art, particularly in a polishing step that is used to open up the gate area in order to remove the dummy gate therein. In addition, work function metal that is deposited during the replacement metal gate process, as well as the metal gate itself will need to be recessed in order to avoid contact with the borderless contact.

SUMMARY OF EMBODIMENTS OF THE INVENTION

Embodiments of the present invention provide a method of forming a semiconductor structure. The method includes at least steps of providing a transistor structure having a sacrificial gate, formed on top of a channel region in a substrate, and source and drain regions next to the sacrificial gate; forming a dielectric layer surrounding the sacrificial gate; removing the sacrificial gate to create an opening inside the dielectric layer, the opening exposing the channel region; depositing a work-function layer lining the opening; forming a gate conductor directly on top of a first portion of the work-function layer, the first portion of the work-function layer being on top of the channel region; and removing a second portion of the work-function layer, the removal of the second portion of the work-function layer insulating the first portion of the work-function layer from rest of the work-function layer.

In one embodiment, forming the gate conductor includes forming spacers along sidewalls of the opening; and filling the opening, surrounded by the spacers, with a conductive material to form the gate conductor.

In another embodiment, removing the second portion of the work-function layer includes removing the spacers after forming the gate conductor; and etching the second portion of the work-function layer that is underneath the spacers.

According to one embodiment, the spacers include silicon-nitride (SiN) material and removing the spacers includes applying a hot phosphorus solution to etch the spacers, the hot phosphorus solution causing little or no etching effect to the gate conductor.

In one embodiment, etching the second portion of the work-function layer includes applying a directional etching process in the etching, wherein the directional etching process lowers a height of the work-function layer that is next to the sidewalls of the opening and lowers a height of the gate conductor.

According to one embodiment, the work-function layer is a titanium-nitride (TiN) layer or a TiN layer doped with Al, and has a thickness ranging from about 1 nm to about 5 nm.

Furthermore, the dielectric layer is of a first dielectric material, and the method further includes covering the gate conductor with a second dielectric material, the second dielectric material filling a space created by the removal of the second portion of the work-function layer and the spacers, the second dielectric material covering the gate conductor and insulating the first portion of the work-function layer from the rest of the work-function layer that is outside the second portion of the work-function layer.

In one embodiment, the method includes removing the rest of the work-function layer, which may include removing selectively the first dielectric material of the dielectric layer to expose the rest of the work-function layer that is next to the opening; selectively removing the exposed work-function layer; and depositing a new dielectric layer to surround the second dielectric material that covers the gate conductor.

Embodiments of the present invention also provide a semiconductor transistor structure, which includes, at least, a semiconductor substrate; a gate conductor on top of a first portion of a work-function metal layer, the first portion of the work-function metal layer being on top of a channel region of a transistor formed inside the semiconductor substrate; and a dielectric material surrounding the gate conductor and the first portion of the work-function metal layer.

BRIEF DESCRIPTION OF THE DRAWINGS

The present invention will be understood and appreciated more fully from the following detailed description of preferred embodiments, taken in conjunction with the accompanying drawings of which:

FIGS. 1(a) and 1(b) are demonstrative illustrations of a method of forming transistors with replacement metal gate and borderless contacts according to an embodiment of the present invention;

FIG. 4 is a demonstrative illustration of cross-sectional view of a structure in a step of a method of forming transistors with borderless contact, following the step illustrated in FIG. 3, according to an embodiment of the invention;

FIG. 5 is a demonstrative illustration of cross-sectional view of a structure in a step of a method of forming transistors with borderless contact, following the step illustrated in FIG. 4, according to an embodiment of the invention;

FIG. 6 is a demonstrative illustration of cross-sectional view of a structure in a step of a method of forming transistors with borderless contact, following the step illustrated in FIG. 5, according to an embodiment of the invention;

FIG. 7 is a demonstrative illustration of cross-sectional view of a structure in a step of a method of forming transistors with borderless contact, following the step illustrated in FIG. 6, according to an embodiment of the invention;

FIG. 8 is a demonstrative illustration of cross-sectional view of a structure in a step of a method of forming transistors with borderless contact, following the step illustrated in FIG. 7, according to an embodiment of the invention;

FIG. 9 is a demonstrative illustration of cross-sectional view of a structure in a step of a method of forming transistors with borderless contact, following the step illustrated in FIG. 8, according to an embodiment of the invention;

Figure 2:
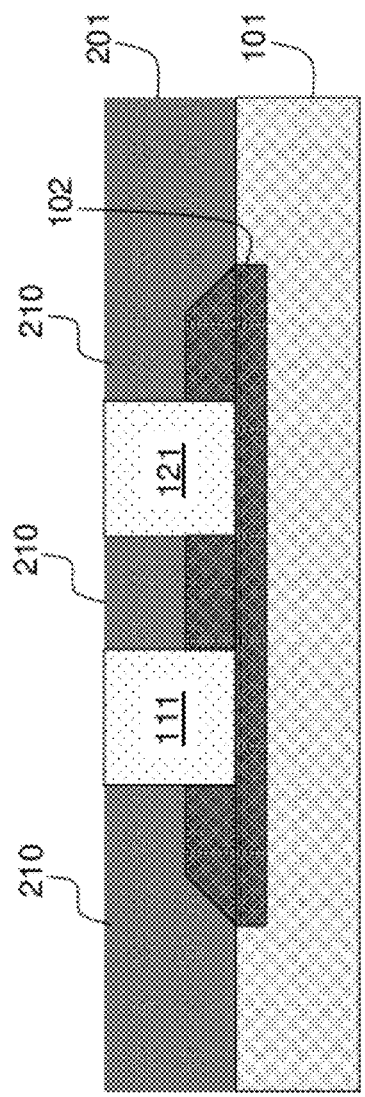
FIG. 2 is a demonstrative illustration of cross-sectional view of a structure in a step of a method of forming transistors with borderless contact, following the step illustrated in FIG. 1(a), according to an embodiment of the invention.

It will be appreciated that for the purpose of simplicity and clarity of illustration, elements in the drawings have not necessarily been drawn to scale. For example, dimensions of some of the elements may be exaggerated relative to those of other elements for clarity purpose.

DETAILED DESCRIPTION OF THE INVENTION

In the following detailed description, numerous specific details are set forth in order to provide a thorough understanding of various embodiments of the invention. However, it is to be understood that embodiments of the invention may be practiced without these specific details.

In the interest of not obscuring presentation of essences and/or embodiments of the invention, in the following detailed description, some processing steps and/or operations that are known in the art may have been combined together for presentation and/or for illustration purpose and in some instances may have not been described in detail. In other instances, some processing steps and/or operations that are known in the art may not be described at all. In addition, some well-known device processing techniques may have not been described in detail and, in some instances, may be referred to other published articles, patents, and/or published patent applications for reference in order not to obscure description of essence and/or embodiments of the invention. It is to be understood that the following descriptions may have rather focused on distinctive features and/or elements of various embodiments of the invention.

FIGS. 1(a) and 1(b) are demonstrative illustrations of cross-sectional views of structures in a step of a method of forming transistors with borderless contact according to an embodiment of the present invention. For example, the method may include forming one or more transistors such as transistors 110 and 120 on top of a substrate 101. In FIGS. 1(a) and 1(b), transistors 110 and 120 are illustrated to have raised source and drain 103 and are formed, via a channel region 102, on top of a silicon-on-insulator (SOI) substrate 101. However, a person skilled in the art will appreciate that embodiments of the present invention are not limited to the above particulars and substrate 101 may be any semiconductor substrate that is suitable for forming transistors thereupon, including, for example, a bulk silicon substrate, a germanium-doped silicon substrate, a strained silicon substrate, a substrate with buried oxide (BOX), a strained silicon directly on insulator (SSDOI), or a partially depleted silicon-on-insulator (PDSOI) substrate. Other types of substrate may be used as well. In addition, transistors 110 and 120 may have other types of source and drain, instead of raised source and drain as being illustrated in FIGS. 1(a) and 1(b). In other words, embodiments of the present invention are not limited in their applications for transistors with raised source and drain. Furthermore, transistors 110 and 120 may be formed, as being illustrated in the following drawings, through a replacement-metal-gate (RMG) process and in particular a gate-last RMG process, although embodiments of the present invention may be applied to transistors formed through other processes.

Embodiment of the present invention may start with a structure illustrated in FIG. 1(a), wherein transistors 110 and 120 may be initially formed to include sacrificial gates 111 and 121 on top of channel region 102. Sacrificial gates 111 and 121 may be partially surrounded by raised source and drain 103. In one embodiment, spacers may be optionally formed next to sidewalls of sacrificial gates 111 and 121 and on top of raised source/drain regions 103. For example, a set of spacers 112 may be formed next to sidewalls of sacrificial gate 111 and another set of spacers 122 may be formed next to sidewalls of sacrificial gate 121 as being demonstratively illustrated in FIG. 1(b). A person skilled in the art will appreciate that embodiments of the present invention are not limited in the above aspects and other structures of variations of FIGS. 1(a) and 1(b) may be used as well without deviation from the spirit of the present invention. In the following description, without loss of generality, the use of structure shown in FIG. 1(a) is assumed.

FIG. 2 is a demonstrative illustration of cross-sectional view of a structure in a step of a method of forming transistors with borderless contact, following the step shown in FIG. 1(a), according to an embodiment of the present invention. More specifically, the method may include forming, through deposition for example, a dielectric layer 201 on top of substrate 101. Dielectric layer 201 may be deposited to have a thickness such that it has a height higher than that of sacrificial gates 111 and 121 and therefore covering sacrificial gates 111 and 121. Dielectric layer 201 may be made of silicon-oxide, nitride-oxide, or any other suitable insulating materials. After the deposition, height of dielectric layer 201 may be lowered through, for example, a chemical-mechanical-polishing (CMP) process to expose, from top, sacrificial gates 111 and 121 in preparation such that sacrificial gates 111 and 121 may be removed in a subsequent step. The height lowering process may create a flat top surface 210 of dielectric layer 201, co-planar with that of sacrificial gates 111 and 121.

Some level of over-polishing of sacrificial gates 111 and 121 during the CMP process is generally acceptable.

Figure 3:
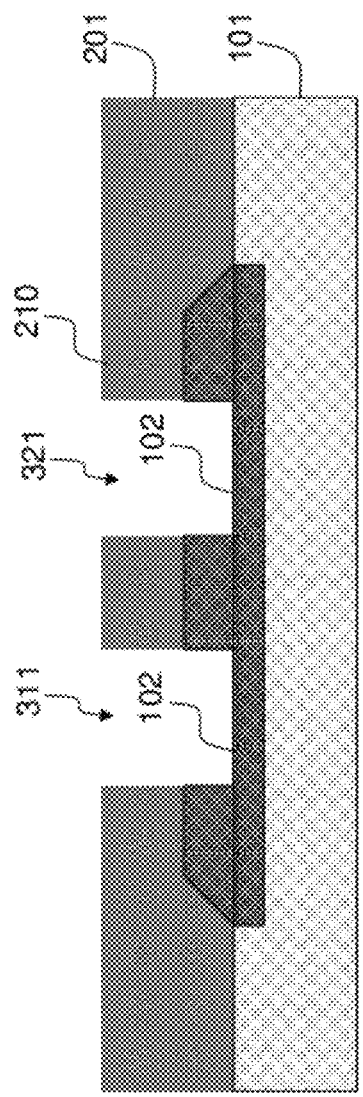
FIG. 3 is a demonstrative illustration of cross-sectional view of a structure in a step of a method of forming transistors with borderless contact, following the step illustrated in FIG. 2, according to an embodiment of the invention.

FIG. 3 is a demonstrative illustration of cross-sectional view of a structure in a step of a method of forming transistors with borderless contact, following the step shown in FIG. 2, according to an embodiment of the present invention. With their top surfaces being exposed through CMP, sacrificial gates 111 and 121 may be removed through a selective etching process. For example, when sacrificial gates 111 and 121 are made of polysilicon and dielectric layer 201 is made of silicon-oxide, a reactive ion etching (RIE) process employing $SF_6$ and $HBr/O_2$ may be used to remove only sacrificial gates 111 and 121 with minimal impact on dielectric layer 201 and channel region 102 underneath sacrificial gates 111 and 121. As another example, when sacrificial gates 111 and 121 are made of carbon, a $H_2$ and $O_2$ ash process may be used to selectively remove sacrificial gates 111 and 121. A gate dielectric layer underneath gates 111 and 121 may be used, in some embodiment, as an etch-stop layer during the removal of gates 111 and 121. Moreover, the selective etching process may also be carefully designed to minimize erosion to sidewalls in the opening 311 and 321 created by the removal of gates 111 and 121.

FIG. 4 is a demonstrative illustration of cross-sectional view of a structure in a step of a method of forming transistors with borderless contact, following the step shown in FIG. 3, according to an embodiment of the present invention. For example, during this step, a work-function material such as metal may be deposited into openings 311 and 321 to form a conformal layer 401. The target of this step is to form a layer of work-function material on top of the gate dielectric layer (not shown), which is on top of channel regions 102. Therefore, according to one embodiment of the present invention, other methods that form non-conformal layers may be used as well so long as the formation of such non-conformal layers does not cause pitch-off at areas close to the top of openings 311 and 321. If pitch-off does happen, the pitch-off may pose difficulty for the deposition of work-function material at the bottom of openings 311 and 321. Work-function layer 401 covers bottom and sidewalls of openings 311 and 321 as well as top surface 210 of dielectric layer 201. Work-function layer 401 may be a metal layer or a metal-containing layer including materials that are made of, for example, titanium-nitride (TiN), or TiN doped with Al and/or other suitable threshold voltage adjusting metals. Work-function layer 401 may be deposited to have a thickness ranging from about 1 nm to about 5 nm, a proper thickness of which ensures proper adjustment of the on-off threshold of transistors 110 and 120.

FIG. 5 is a demonstrative illustration of cross-sectional view of a structure in a step of a method of forming transistors with borderless contact, following the step shown in FIG. 4, according to an embodiment of the present invention. More specifically, at this step, sidewall spacers 511 and 521 maybe formed at sidewalls of openings 311 and 321 next to work-function layer 401. The formation of sidewall spacers 511 and 521 maybe made through, for example, first depositing a generally conformal dielectric layer covering work-function layer 401, and subsequently performing a directional etching to remove most of the deposited dielectric layer leaving only spacers 511 at the sidewalls of opening 311 and spacers 521 at the sidewalls of opening 321. Sidewall spacers 511 and 521 are formed to have a sufficient width, between about 3 nm to about 10 nm, on top of work-function layer 401 covering the bottom of openings 311 and 321 such that when the portion of work-function layer 401 underneath spacers 511 and 521 are removed, as being described below in more details with reference to FIG. 8, the central bottom portion of work-function layer 401 may be properly isolated from the rest of work-function layer 401. In other words, the central bottom portion of work-function layer 401 may be sufficiently electrically insulated.

FIG. 6 is a demonstrative illustration of cross-sectional view of a structure in a step of a method of forming transistors with borderless contact, following the step shown in FIG. 5, according to an embodiment of the present invention. For example, during this step, materials that are suitable as gate conductor may be deposited into openings 311 and 321, whose sidewalls are now covered by spacers 511 and 521. Suitable gate conductor materials may include, for example, Al, Cu, or W which may be deposited through a chemical vapor deposition (CVD) process. In an alternative embodiment, gate conductor materials may be electroplated into openings 311 and 321. The deposition may be performed under proper temperature, pressure, as well as sufficient time duration, as is known in the art, such that the gate conductor materials cover the entire openings 311 and 321 and top surface of work-function layer 401. Following the deposition, a CMP process may be performed to remove excess gate conductor materials, including removing portions of work-function layer 401 that lie on top surface 210 of dielectric layer 201, and remove at least a top portion of sidewall spacers 511 and 521. The CMP process forms gate conductor 610 and 620 for transistors 110 and 120; creates a top surface 601 of dielectric layer 201; and expose top surface 512 and 522 of sidewall spacers 511 and 521.

FIG. 7 is a demonstrative illustration of cross-sectional view of a structure in a step of a method of forming transistors with borderless contact, following the step shown in FIG. 6, according to an embodiment of the present invention. More specifically, during this step, sidewall spacers 511 and 521 may be removed through the exposed top surfaces 512 and 522 by, for example, a wet etching process. In other words, sidewall spacers 511 and 521 may be removed or pulled out between gate conductor 610 (or 620) and sidewalls of opening 311 (or 321). In one embodiment, a hot phosphorus solution may be used in the removal of spacers 511 and 521 that are made of silicon-nitride (SiN). The hot phosphorus solution may be selective to the SiN material and may cause little or no etching effect to materials of gate conductor 610 and 620 as well as work-function material 401 lining openings 311 and 321. In another embodiment, spacers 511 and 521 may be made of oxide and a HF process may be used to remove spacers 511 and 521. Corresponding removal processes may be used for other types of spacer materials. The removal of sidewall spacers 511 and 521 creates openings 712 and 722 that expose at least portions of work-function layer 401 that cover bottom surface of opening 311 and 321.

FIG. 8 is a demonstrative illustration of cross-sectional view of a structure in a step of a method of forming transistors with borderless contact, following the step shown in FIG. 7, according to an embodiment of the present invention. More specifically, embodiment of the present invention includes applying a directional or anisotropic etching process to remove at least some of work-function layer 401 that is directly on top of channel regions 102 of transistor 110 and 120. In one embodiment, the anisotropic etching process removes a portion of work-functional layer 401 that is not covered by but next to the portion covered by gate conductors 610 and 620, causing the central functional portions 411 and 421 (covered by gate conductors 610 and 620) of work-function layer 401 being electrically insulated from the rest portion 412 and 422, respectively, of work-function layer 401. For example, work-function layers 411 and 421 may be insulated from work-functional layers 412 and 422, respectively, by openings 811 and 821 that are created by the removal of spacers 511 and 521 and the work-functional layer underneath thereof. In yet another embodiment, an isotropic etching process may be applied to remove rest of work-function layer 401 except portions 411 and 421 that are underneath gate conductors 610 and 620. The isotropic etching may be selective to cause no or little etching effects to gate conductors 610 and 620.

The above etching process, while creating insulated work-function layers 411 and 421 that are underneath gate conductors 610 and 620, may cause the lowering of height of work-function layers 412 and 422 which remain at the sidewalls of openings 311 and 312 as being demonstratively illustrated in FIG. 8. Dependent upon the selectivity of etchant used in the selective removal of work-functional layer, height of gate conductors 610 and 620 may be lowered as well, to some extent.

FIG. 9 is a demonstrative illustration of cross-sectional view of a structure in a step of a method of forming transistors with borderless contact, following the step shown in FIG. 8, according to an embodiment of the present invention. During this step, dielectric material 911 maybe deposited in to openings 811 and 821, causing gate conductors 610 and 620 and work-function layers 411 and 421 underneath thereof respectively to be insulated from work-function layer 412 and 422 lining sidewalls of openings 311 and 321. Following the deposition, excess dielectric material 911 may be removed through, for example, a CMP process to create a flat top surface 901. As being illustrated in FIG. 9, gate conductors 610 and 620 may be surrounded by dielectric material 911. Dielectric material 911 may be, for example, SiN or other suitable insulating materials.

The CMP process creates top surface 901 without exposing gate conductors 610 and 620 which continue to be covered by dielectric material 911 as being illustrated in FIG. 9. In one embodiment, the CMP process is performed down to exposes dielectric layer 201 and top surface 901 is the same as top surface 601. In another embodiment, the CMP process may polish beyond top surface 601 and down to level B-B' to further expose gate conductors 610 and 620, in which case gate conductors 610 and 620 may be used as an etch-stop layer. In yet another embodiment, the CMP process may polish down to level C-C' to expose gate conductors 610 and 620 as well as top of work-function layers 412 and 422. A person skilled in the art will appreciate from the above description that other variations may be possible without deviation from the spirit of present invention.

Figure 10A:
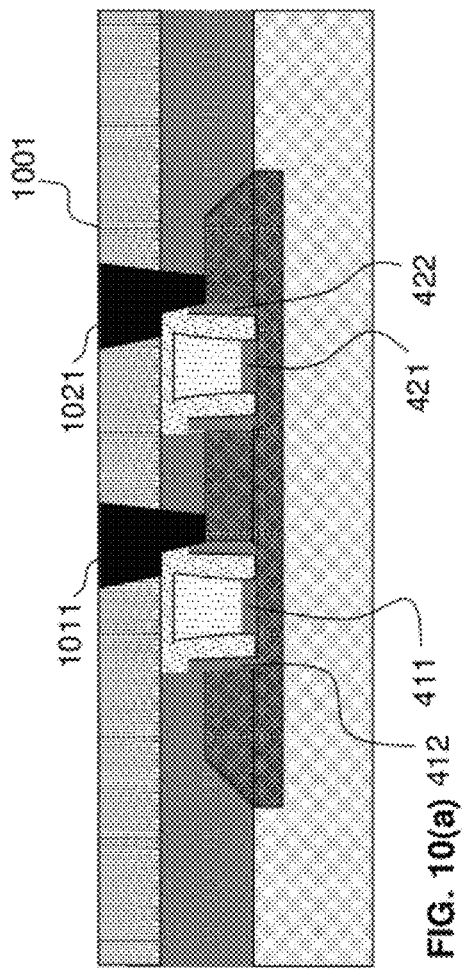
FIGS. 10(a) and 10(b) are demonstrative illustrations of a method of forming transistors with replacement metal gate and borderless contacts, following the step illustrated in FIG. 9, according to an embodiment of the invention.
Figure 10B:
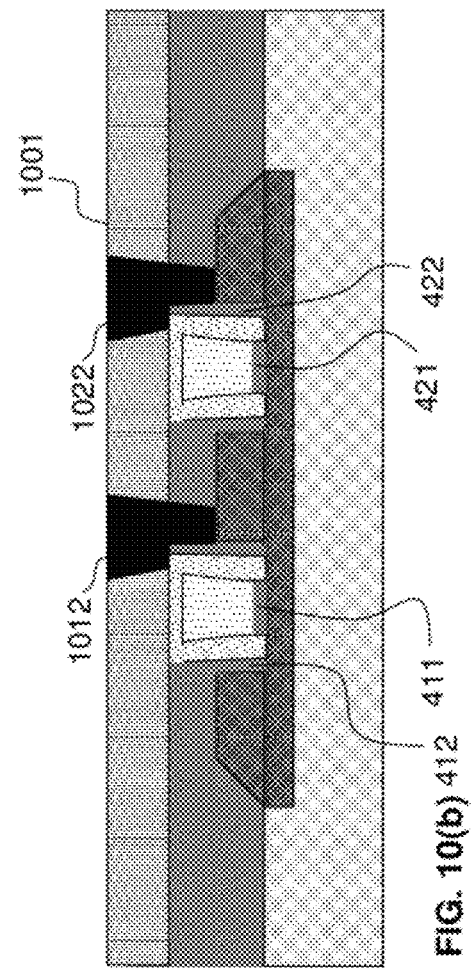

FIGS. 10(a) and 10(b) are demonstrative illustrations of cross-sectional view of a structure in a step of forming borderless contact for transistors, following the step shown in FIG. 9, according to an embodiment of the present invention. After covering gate conductors 610 and 620 with dielectric material 911, another dielectric layer 1001 may be optionally deposited on top of dielectric material 911. The deposition of optional dielectric layer 1001 may be performed in order to ensure that there is an adequate thickness of overall dielectric material, over transistors 110 and 120, wherein conductive contacts will be formed.

For example, in FIG. 10(a), conductive contacts 1011 and 1021 may be formed through an etch-and-deposition process to contact source and/or drain of transistors 110 and 120. According to one embodiment of the present invention, because work-function layers 412 and 422 at the sidewalls of gate forming openings 311 and 321 are insulated from work-function layers 411 and 421 that are underneath gate conductors 610 and 620, even if conductive contacts 1011 and 1021 are formed to be in contact with work-function layers 412 and 422, shorting may be avoided between gate conductors 610 and source/drain contact 1011, or between gate conductor 620 and source/drain contact 1021. FIG. 10(b) is another example where work-function layers 412 and 422 have a height that is higher than the gate conductor causing to be in direct contact with conductive contacts 1012 and 1022. Nevertheless, such contacts are not concerns for shorting since work-function layers 411 and 421 underneath gate conductors 610 and 620 are insulated from work-function layers 412 and 422 at the sidewalls.

Figure 11:
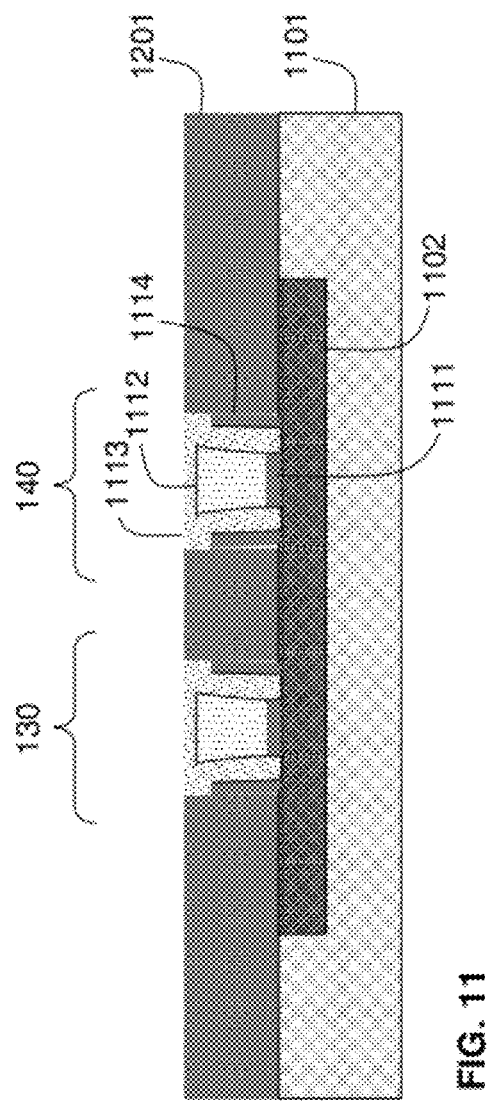
FIG. 11 is a demonstrative illustration of cross-sectional view of a structure in a step of a method of forming transistors with borderless contact according to an embodiment of the invention.

FIG. 11 is a demonstrative illustration of cross-sectional view of a structure in a step of a method of forming transistors with borderless contact according to an embodiment of the present invention. In this embodiment, it is assumed that transistors 130 and 140 include source/drain regions 1102 that are formed inside substrate 1101 next to their respective channel regions, other than having raised source/drain as transistors 110 and 120 shown in FIG. 1(a). Transistors 130 and 140 may be formed, in large part, through steps similar to those illustrated in FIGS. 2-9. For example, transistor 140 may have gate conductor 1112 formed on top of work-function layer or work-function metal 1111 that is on top of the channel region of transistor 140 via a gate dielectric layer. According to one embodiment, work-function metal 1111 may be isolated and/or insulated from the rest of work-function layer or metal 1114 by a dielectric material 1113. Similar to transistor 120, the gate structure of transistor 140 is formed through a replacement metal gate process surrounded by a dielectric layer 1201.

Figure 12:
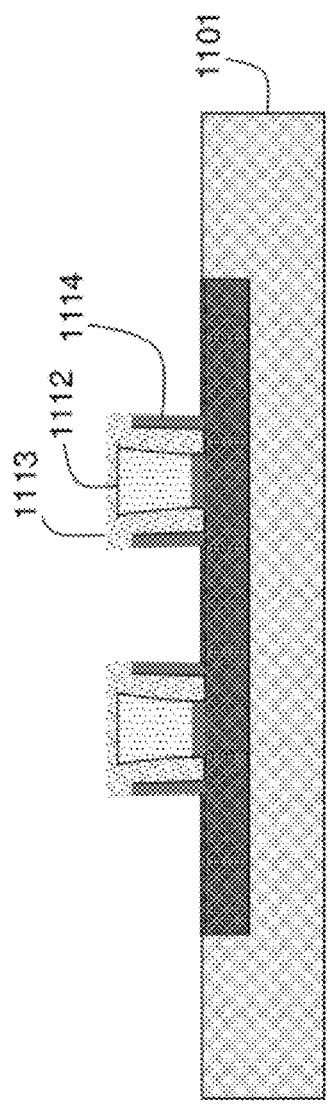
FIG. 12 is a demonstrative illustration of cross-sectional view of a structure in a step of a method of forming transistors with borderless contact, following the step illustrated in FIG. 11, according to an embodiment of the invention.
Figure 13:
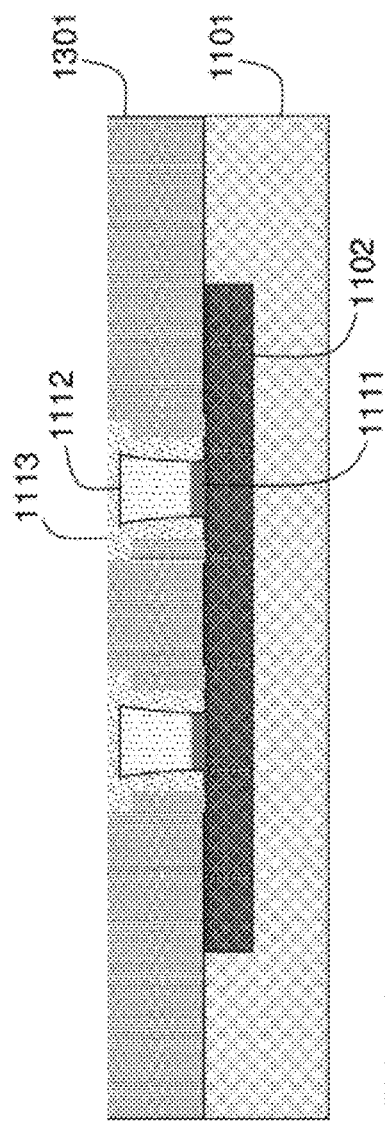
FIG. 13 is a demonstrative illustration of cross-sectional view of a structure in a step of a method of forming transistors with borderless contact, following the step illustrated in FIG. 12, according to an embodiment of the invention.
Figure 14:
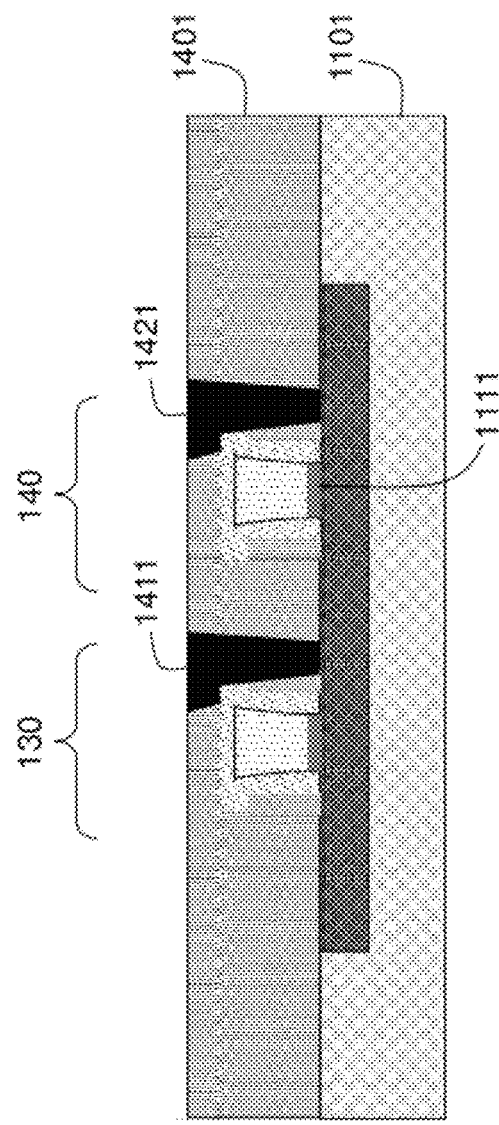
FIG. 14 is a demonstrative illustration of cross-sectional view of a structure in a step of a method of forming transistors with borderless contact, following the step illustrated in FIG. 13, according to an embodiment of the invention.

FIG. 12 is a demonstrative illustration of cross-sectional view of a structure in a step of a method of forming transistors with borderless contact, following the step shown in FIG. 11, according to an embodiment of the present invention. More specifically, during this step, dielectric layer 1201 surrounding gate structure of transistors 130 and 140 may be removed thereby exposing work-function metal 1114 what was originally formed along sidewalls of the openings in dielectric layer 1201. After the removal of dielectric layer 1201, according to one embodiment, work-function metal 1114 may be stripped off through, for example, a selective etching process as being demonstratively illustrated in FIG. 13. The removal of work-function metal 1114, which surrounds gate metal 1112 but provides no functionality as a work-function metal, reduces parasitic capacitance of transistors 130 and 140, and thereby improves the speed and performance thereof. Subsequently, a new layer of dielectric material 1301 may be formed through, for example, deposition that surrounds the gate structure of transistors 130 and 140. The new dielectric layer may be made to have the same thickness as the height of gate structure of transistors 130 and 140, as dielectric layer 1301 shown in FIG. 13, or thicker than that as dielectric layer 1401 shown in FIG. 14, depending upon the need to form inside thereof conductive contacts. For example, as being illustrated in FIG. 14, conductive contacts 1411 and 1421 may be formed inside dielectric layer 1401 that contact source and/or drain regions of transistors 130 and 140. There is no work-function metal that may possibly become contacted by conductive contacts 1411 and 1421 eliminating the possibility of shorting source/drain with the work-function metal 1111 underneath gate conductor 1112.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the spirit of the invention.

What is claimed is:

1. A method comprising:
    creating an opening inside a dielectric layer, said dielectric layer being formed on top of a substrate and said opening exposing a channel region of a transistor in said substrate;
    depositing a work-function layer lining said opening and covering said channel region;
    forming a gate conductor covering a first portion of said work-function layer, said first portion of said work-function layer being on top of said channel region; and
    removing a second portion of said work-function layer, said second portion of said work-function layer surrounding said first portion of said work-function layer, wherein said removal of said second portion of said work-function layer insulates said first portion of said work-function layer from rest of said work-function layer.

2. The method of claim 1, wherein forming said gate conductor comprises:
    forming sidewall spacers along sidewalls of said opening;
    filling said opening, surrounded by said sidewall spacers, with a conductive material to form said gate conductor; and
    applying a chemical-mechanical-polishing (CMP) process to remove excess of said conductive material that are on top of said dielectric layer.

3. The method of claim 2, wherein removing said second portion of said work-function layer comprises:
    applying said CMP process to polish down said conductive material to expose a top portion of said sidewall spacers;
    removing said sidewall spacers exposed by said CMP process; and
    etching said second portion of said work-function layer that is exposed by said removal of said sidewall spacers.

4. The method of claim 3, wherein said sidewall spacers is made of silicon-nitride (SiN) and wherein said removing said sidewall spacers comprises applying a hot phosphorus solution to etch said sidewall spacers, said hot phosphorus solution causing no or substantially little etching effect to said gate conductor.

5. The method of claim 3, wherein etching said second portion of said work-function layer comprises applying a directional etching process in said etching, wherein said directional etching process lowers a height of said work-function layer next to said sidewalls of said opening.

6. The method of claim 1, wherein said work-function layer is a titanium-nitride (TiN) layer or a TiN layer doped with Al, and has a thickness ranging from about 1 nm to about 5 nm.

7. The method of claim 2, wherein said dielectric layer is of a first dielectric material, further comprising covering said gate conductor with a second dielectric material, said second dielectric material filling a space created by said removal of said second portion of said work-function layer and said sidewall spacers, said second dielectric material insulating said first portion of said work-function layer from said rest of said work-function layer that is outside said second portion of said work-function layer.

8. The method of claim 7, further comprising:
    removing said first dielectric material of said dielectric layer;
    removing said rest of said work-function layer; and
    forming a new dielectric layer surrounding said second dielectric material in replacement of said first dielectric material and said rest of said work-function layer.

9. The method of claim 8, further comprising forming one or more conductive contacts inside said new dielectric layer, said one or more conductive contacts contacting a source/drain of said transistor.

10. The method of claim 1, further comprising forming one or more conductive contacts inside said dielectric layer, said one or more conductive contacts contacting a raised source/drain of said transistor.

11. A method comprising:
    providing a transistor structure having a sacrificial gate, formed on top of a channel region in a substrate, and source and drain regions next to said sacrificial gate;
    forming a dielectric layer surrounding said sacrificial gate;
    removing said sacrificial gate to create an opening inside said dielectric layer, said opening exposing said channel region;
    depositing a work-function layer lining said opening;
    forming a gate conductor directly on top of a first portion of said work-function layer, said first portion of said work-function layer being on top of said channel region; and
    removing a second portion of said work-function layer, said removal of said second portion of said work-function layer insulating said first portion of said work-function layer from rest of said work-function layer.

12. The method of claim 11, wherein forming said gate conductor comprises:
    forming spacers along sidewalls of said opening; and
    filling said opening, surrounded by said spacers, with a conductive material to form said gate conductor.

13. The method of claim 12, wherein removing said second portion of said work-function layer comprises:
    removing said spacers after forming said gate conductor; and
    etching said second portion of said work-function layer that is underneath said spacers.

14. The method of claim 13, wherein said spacers comprise silicon-nitride (SiN) material and removing said spacers comprises applying a hot phosphorus solution to etch said spacers, said hot phosphorus solution causing little or no etching effect to said gate conductor.

15. The method of claim 13, wherein etching said second portion of said work-function layer comprises applying a directional etching process in said etching, wherein said directional etching process lowers a height of said work-function layer that is next to said sidewalls of said opening and lowers a height of said gate conductor.

16. The method of claim 11, wherein said work-function layer is a titanium-nitride (TiN) layer or a TiN layer doped with Al, and has a thickness ranging from about 1 nm to about 5 nm.

17. The method of claim 13, wherein said dielectric layer is of a first dielectric material, further comprising covering said gate conductor with a second dielectric material, said second dielectric material filling a space created by said removal of said second portion of said work-function layer and said spacers, said second dielectric material covering said gate conductor and insulating said first portion of said work-function layer from said rest of said work-function layer that is outside said second portion of said work-function layer.

18. The method of claim 17, further comprising removing said rest of said work-function layer.

19. The method of claim 18, wherein removing said rest of said work-function layer comprises
    selectively removing said first dielectric material of said dielectric layer to expose said rest of said work-function layer that is next to said opening;
    selectively removing said exposed work-function layer; and depositing a new dielectric layer to surround said second dielectric material that covers said gate conductor.

20. The method of claim 18, further comprising forming one or more conductive contacts inside said new dielectric layer, said one or more conductive contacts contacting at least one source/drain region of said transistor.

21. The method of claim 11, further comprising forming one or more conductive contacts inside said dielectric layer, said one or more conductive contacts contacting at least one raised source/drain region of said transistor.

* * * * *